US006707333B2

(12) United States Patent
Matsumoto et al.

(10) Patent No.: US 6,707,333 B2
(45) Date of Patent: Mar. 16, 2004

(54) BIAS CIRCUIT

(75) Inventors: Osamu Matsumoto, Tokyo (JP); Masao Ito, Tokyo (JP); Naoko Suwa, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/234,479

(22) Filed: Sep. 5, 2002

(65) Prior Publication Data

US 2003/0174012 A1 Sep. 18, 2003

(30) Foreign Application Priority Data

Mar. 18, 2002 (JP) ....................................... 2002-074862

(51) Int. Cl.[7] ................................................ H03K 3/01
(52) U.S. Cl. ....................................... 327/534; 327/561
(58) Field of Search ................................ 327/534, 535, 327/537, 538, 539, 540, 541, 543, 560, 561, 562, 563

(56) References Cited

U.S. PATENT DOCUMENTS 5,838,192 A * 11/1998 Bowers et al. .............. 327/541
6,091,285 A * 7/2000 Fujiwara ..................... 327/539

OTHER PUBLICATIONS

Gray, Paul R., et al., Analysis and Design of Analog Integrated Circuits, Fourth Edition. New York: Wiley, 2001, pp. 309–312.

Nauta, Bram, et al., "A 70–MS/s 110–mW 8–b CMOS Folding and Interpolating A/D Converter." IEEE Journal of Solid–State Circuits, vol. 30, No. 12, Dec. 1995, pp. 1302–1308. (Manuscript received May 10, 1995; revised Aug. 27, 1995).

* cited by examiner

*Primary Examiner*—Jeffrey Zweizig
(74) *Attorney, Agent, or Firm*—Burns, Doane, Swecker & Mathis, LLP

(57) ABSTRACT

A Veff detector circuit generates input voltages VEP, VEN on the basis of a bias voltage which is fed back so that the difference between these input voltages may be a saturation voltage Veff, and a four-input operational amplifier means receives the input voltages VEP, VEN generated by the Veff detector circuit and generates the bias voltage VB by using reference voltages VERP, VERN which are externally inputted.

5 Claims, 10 Drawing Sheets

INPUT/OUTPUT CHARACTERISTIC OF DIFFERENTIAL AMPLIFIER

BIAS CIRCUIT

BACKGROUND OF THE INVENTION

1. Field of the Invention

The present invention relates to a bias circuit operating without any effect of variations in circuit elements caused in a manufacturing process, for supplying a bias voltage with high accuracy to A/D converters and the like.

2. Description of the Prior Art

FIG. 15 is an illustration of a differential amplifier using a conventional bias circuit. This figure shows an equivalent circuit of the differential amplifier in operation. In FIG. 15, reference numeral 100 denotes a current source; R1 and R2 each denotes a resistor having a resistance value of R; I denotes a current flowing in the resistors R1 and R2; and M11 and M12 each denotes transistors. Reference sign Vip represents a positive input voltage and Vin represents a negative input voltage, both of which are differential voltages inputted to the differential amplifier. Reference sign Vop represents a positive output voltage and Von represents a negative output voltage, both of which are differential voltages outputted from the differential amplifier.

FIG. 16 is an illustration of the conventional bias circuit. The bias circuit of this figure is, e.g., a Vth-referenced bias circuit shown in Gray, Mayer 4th Edition, P. 311. In FIG. 16, reference signs M3 to M6 denote transistors; R3 denotes a resistor having a resistance value of R; I denotes a current flowing in the resistor R3; and Vgs represents a gate-source voltage of the transistor M5. Further, the relation Vgs=R·I holds herein.

Next, the operation will be discussed.

The input/output characteristic of the differential amplifier shown in FIG. 15 is expressed by the following equation (1):

$$Vop - Von = -RIss\frac{Vip - Vin}{\sqrt{2} \cdot Veff}\sqrt{2 - \frac{(Vip - Vin)^2}{2 \cdot Veff^2}} \tag{1}$$

where Veff represents a saturation voltage of the differential amplifier shown in FIG. 15.

FIG. 17 is an illustration showing the input/output characteristic of the differential amplifier. In FIG. 17, the vertical axis indicates a value of Vop-Von and the horizontal axis indicates a value of Vip-Vin. The input/output characteristic of Eq. (1) is as shown in FIG. 17 and the input range of the differential amplifier is in the range of √2. Veff at the DS operating point. The saturation voltage Veff is defined by the following equation (2):

$$Veff = Vgs - Vth = \sqrt{\frac{Iss}{\beta}} \tag{2}$$

In Eq. (2), Vth represents a threshold voltage of transistors determining an output range, such as the transistors M11 and M12 in the differential amplifier of FIG. 15, and β is a constant. Thus, the input range of the conventional bias circuit depends on the gate-source voltage Vgs during operation of the transistors M11 and M12 and the threshold voltage Vth which the transistors M11 and M12 originally have from the time of manufacture.

With the above-discussed constitution, the conventional bias circuit has a problem that the input range of the differential amplifier can not be set to a predetermined value due to variations in threshold voltage and the like of the resistors and the transistors constituting the circuit.

SUMMARY OF THE INVENTION

The present invention is intended to solve the above problem and it is an object of the present invention to provide a bias circuit which outputs such a bias voltage as to be an originally-set saturation voltage which is generated on the basis of a reference voltage which is externally received and by using an already-outputted bias voltage which is fed back for avoiding an effect of variations in element performance caused in a manufacturing process and an A/D converter which includes the bias circuit and is therefore capable of setting an input range with accuracy.

The bias circuit in accordance with the present invention includes saturation voltage detector means for detecting a saturation voltage from a bias voltage which is fed back to generate an input voltage and operational amplifier means receiving the input voltage outputted from the saturation voltage detector means, for generating a bias voltage by using a reference voltage which is externally inputted.

Therefore, according to the present invention, it is possible to produce an effect of allowing an output of a bias voltage having an accurate value on the basis of the reference voltage, without any effect of variations in circuit elements.

Further, the A/D converter in accordance with the present invention includes a bias circuit which has saturation voltage detector means for detecting a saturation voltage from a bias voltage which is fed back to generate an input voltage and operational amplifier means receiving a reference voltage generated by reference voltage generator means and the input voltage generated by the saturation voltage detector means to generate a bias voltage, the bias circuit for supplying the bias voltage to a plurality of preamplifiers on the basis of the reference voltage.

Therefore, according to the present invention, it is possible to obtaining the bias voltage having an accurate value on the basis of the reference voltage, and this produces an effect that an input range of the A/D converter can be appropriately set to compensate performance degradation due to variations in circuit elements.

Furthermore, the A/D converter in accordance with the present invention includes a bias circuit which has saturation voltage detector means for detecting a saturation voltage from a bias voltage which is fed back to generate an input voltage and operational amplifier means receiving a reference voltage generated by reference voltage generator means and the input voltage generated by the saturation voltage detector means to generate a bias voltage, the bias circuit for supplying the bias voltage to a plurality of folding amplifiers on the basis of the reference voltage.

Therefore, according to the present invention, it is possible to produce an effect that an input range of the A/D converter can be appropriately set to compensate performance degradation due to variations in circuit elements.

DETAILED DESCRIPTION OF THE PREFERRED EMBODIMENTS

An embodiment of the present invention will be described below.

Embodiment 1

Figure 1:
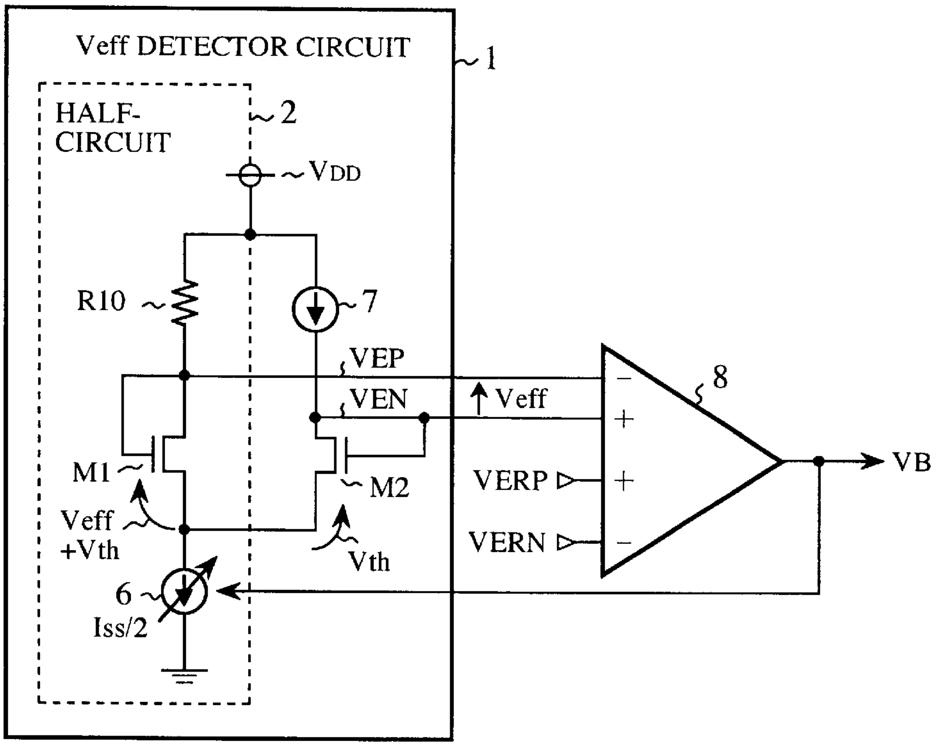
FIG. 1 is an illustration of a bias circuit in accordance with an embodiment 1 of the present invention.

FIG. 1 is an illustration of a bias circuit in accordance with an embodiment 1 of the present invention. In FIG. 1, reference numeral 1 denotes a Veff detector circuit (saturation voltage detector means); 2 denotes a half-circuit which is a constituent of the Veff detector circuit 1; 6 denotes a current source; 7 denotes a microcurrent source; 8 denotes a four-input operational amplifier (operational amplifier means, four-input operational amplifier means); reference sign R10 denotes a resistor; M1 denotes a transistor (the first transistor); and M2 denotes a transistor (the second transistor) having the same characteristics as the transistor M1. Reference sign VDD represents a power supply voltage; VEP represents a positive input voltage; VEN represents a negative input voltage; Veff represents a saturation voltage; VERP represents a positive reference voltage (reference voltage); VERN represents a negative reference voltage (reference voltage); and VB represents a bias voltage outputted from the four-input operational amplifier 8. The bias circuit of the embodiment 1 is constituted of the Veff detector circuit 1 and the four-input operational amplifier 8.

Figure 2:
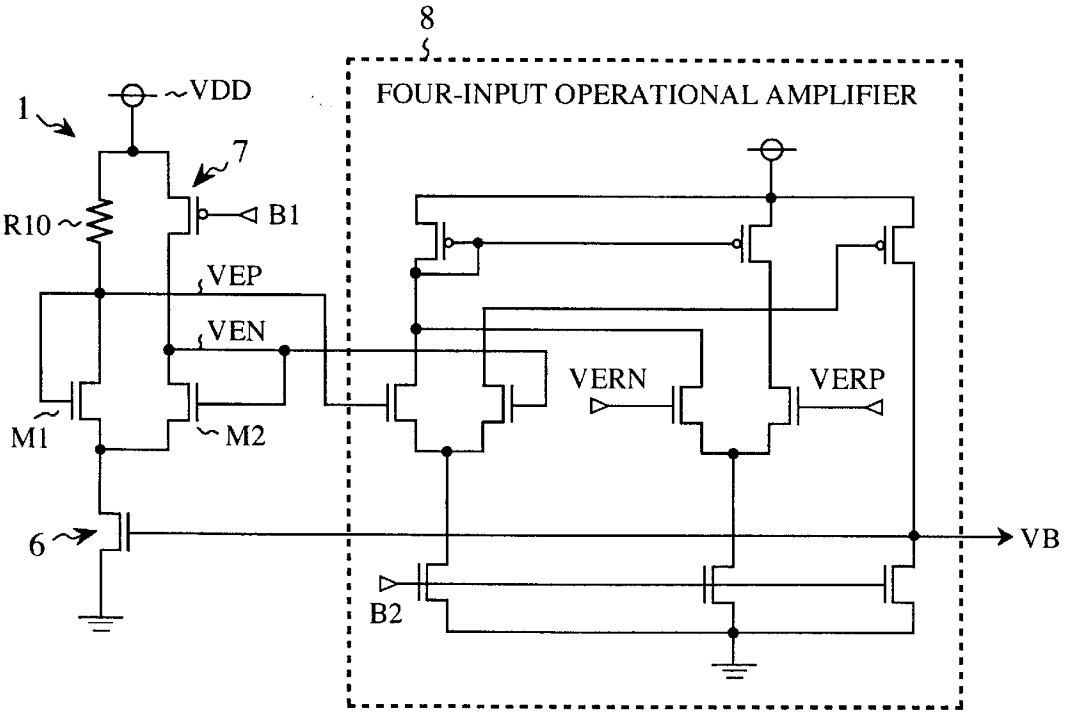
FIG. 2 is a circuit diagram showing an example of the bias circuit in accordance with the embodiment 1 of the present invention.

FIG. 2 is a circuit diagram showing an example of the bias circuit in accordance with the embodiment 1 of the present invention. Constituent elements identical or corresponding to those of FIG. 1 are represented by the same signs and discussion thereof will be omitted. In FIG. 2, reference sign B1 represents a bias voltage supplied to a transistor which is a constituent of the microcurrent source 7 from the outside of the Veff detector circuit 1; and B2 represents a bias voltage driving a current source which is a constituent of the four-input operational amplifier 8.

Figure 3:
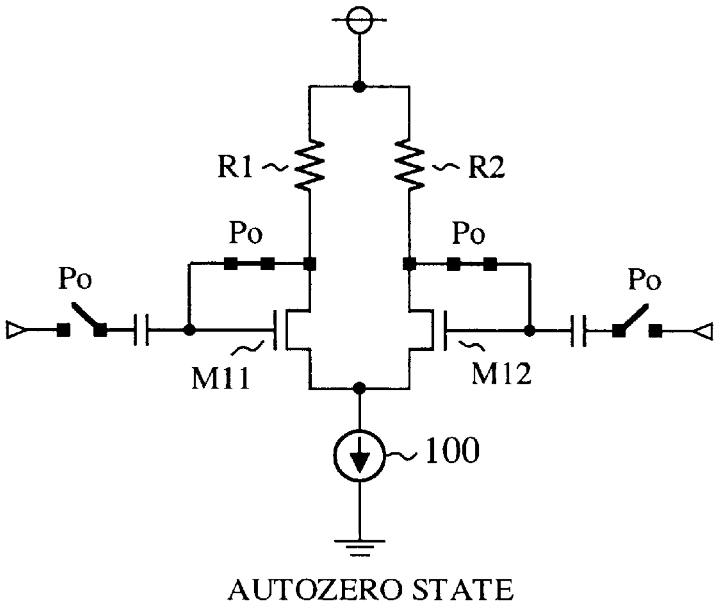
FIG. 3 is an illustration of a case where a differential amplifier is in an autozero state.

FIG. 3 is an illustration of a case where a differential amplifier is in an autozero state. This figure shows an equivalent circuit in a case where a general differential amplifier is in an autozero state. In FIG. 3, reference numeral 100 denotes a current source; reference signs R1 and R2 each denotes a resistor; M11 and M12 each denotes a transistor; and P0 denotes a virtual contact indicating ON/OFF of input/output voltages of the differential amplifier.

The Veff detector circuit 1 is represented in basically the same manner as the differential amplifier in an equivalent circuit. In the half-circuit 2 which is a constituent of the Veff detector circuit 1, the resistor R10 which is supplied with the power supply voltage VDD is connected to a drain of the transistor M1 and a source of the transistor M1 is connected to the current source 6. This constitution is the same as one of the circuits which is differentially amplified by the differential amplifier. Further, the Veff detector circuit 1 includes the microcurrent source 7 and the transistor M2 which are arranged in parallel to the half-circuit 2. The microcurrent source 7 is connected to the power supply voltage VDD and the resistor R10 and supplies its output current to a drain of the transistor M2. Together with the source of the transistor M1, a source of the transistor M2 is also connected to one end of the current source 6. Furthermore, the other end of the current source 6 is grounded.

Next, an operation will be discussed.

The Veff detector circuit 1 of FIG. 1 has a constitution in which the respective gates and drains of the transistors are short-circuited, like e.g., the differential amplifier shown in FIG. 3, and operates in a state where the respective gates and drains of the transistors M1 and M2 are short-circuited.

When the transistors M1 and M2 are thus connected, since a drain current of the transistor M2 which is connected to the microcurrent source 7 is sufficiently smaller than a current value Iss/2 of the current source 6, a drain current of the transistor M1 can be assumed to be substantially Iss/2. Since a microcurrent supplied from the microcurrent source 7 flows in the transistor M2, the gate-source voltage of the transistor M2 is almost the threshold voltage Vth. In this case, since the transistors M1 and M2 have the same characteristics, the gate-source voltage of the transistor M1 is almost a voltage which is higher than the gate-source voltage Vth of the transistor M2 by the saturation voltage Veff. At that time, a potential difference between the positive input voltage VEP outputted from the drain of the transistor M1 and the negative input voltage VEN outputted from the drain of the transistor M2 is the saturation voltage Veff at the DC operating point of this bias circuit.

Detailed discussion will be presented on an operation of the Veff detector circuit 1.

Figure 4:
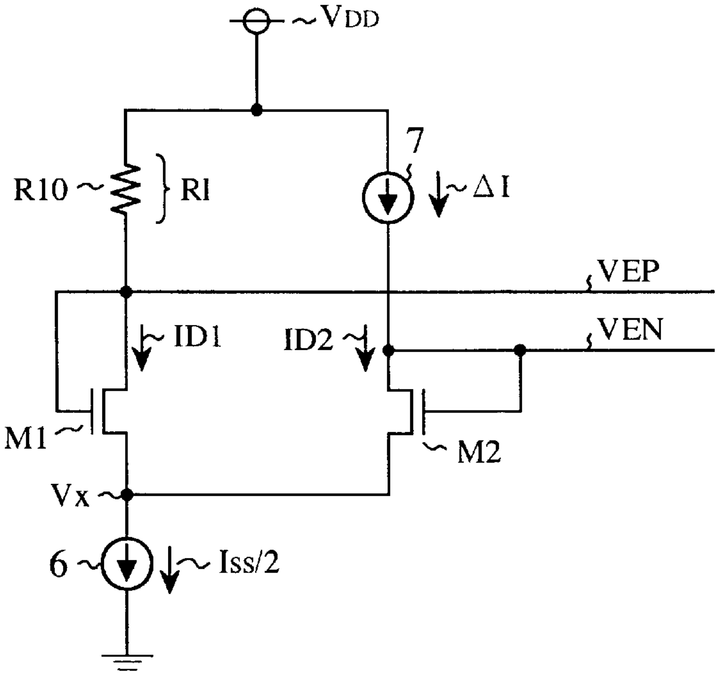
FIG. 4 is an illustration of a Veff detector circuit in accordance with the embodiment 1 of the present invention.

FIG. 4 is an illustration of the Veff detector circuit 1 in accordance with the embodiment 1 of the present invention. Constituent elements identical to those of FIG. 1 are represented by the same signs and discussion thereof will be omitted. In FIG. 4, reference sign ΔI represents a current value of the microcurrent source 7; ID1 represents the drain current of the transistor M1; ID2 represents the drain current of the transistor M2; Iss/2 represents a current value of the current source 6; Vx represents a source potential of the transistors M1 and M2; Vth represents the threshold voltage of the transistors M1 and M2; and R1 represents a resistance value of the resistor R10.

The drain currents ID1 and ID2 of the transistors M1 and M2 are expressed by the following equations (3) and (4), respectively:

$$ID1=Iss/2-\Delta I \tag{3}$$

$$ID2=\Delta I \tag{4}$$

The positive input voltage VEP is expressed by the following equation (5):

$$VEP=VDD-R1\cdot ID1=VDD-R1(Iss/2-\Delta I) \tag{5}$$

The source potential Vx is expressed by the following equation (6):

$$Vx = VEP - \sqrt{\frac{2\cdot ID1}{\beta}} - Vth \tag{6}$$

where β is a constant.

The negative input voltage VEN is expressed by the following equation (7):

$$\begin{aligned} VEN &= Vx + Vth + \sqrt{\frac{2\cdot ID2}{\beta}} \\ &= VDD - R1\left(\frac{Iss}{2} - \Delta I\right) - \sqrt{\frac{Iss - 2\cdot\Delta I}{\beta}} + \sqrt{\frac{2\cdot\Delta I}{\beta}} \end{aligned} \tag{7}$$

From Eq. (5) and Eq. (7), the saturation voltage Veff is obtained as expressed by the following equation (8):

$$\begin{aligned} Veff &= VEP - VEN \\ &= \sqrt{\frac{Iss - 2\cdot\Delta I}{\beta}} - \sqrt{\frac{2\cdot\Delta I}{\beta}} \end{aligned} \tag{8}$$

When the microcurrent ΔI is sufficiently small, Eq. (8) becomes the following equation (9):

$$Veff \approx \sqrt{\frac{Iss}{\beta}} \tag{9}$$

As can be seen from Eq. (9), the saturation voltage Veff which is a difference of the input voltages VEP and VEN generated by the Veff detector circuit of FIG. 4 can be expressed by an equation like the saturation voltage Veff of a general differential amplifier, and depends on the current value of the current source 6. Further, the Veff detector circuit 1 outputs the saturation voltage Veff, not depending on the resistance value R1 of the resistor R10.

The positive input voltage VEP and the negative input voltage VEN outputted from the Veff detector circuit 1 are inputted to the four-input operational amplifier 8. Further, the positive reference voltage VERP and the negative reference voltage VERN are also inputted to the four-input operational amplifier 8 as the reference voltage of the saturation voltage Veff from the outside of the bias circuit. The four-input operational amplifier 8 generates the bias voltage VB by using the positive input voltage VEP and the negative input voltage VEN. At this time, if the difference between the positive input voltage VEP and the negative input voltage VEN, i.e., the saturation voltage Veff is a predetermined value, the bias voltage VB having an accurate value can be outputted. Then, the bias circuit of the embodiment 1 feeds the bias voltage VB outputted from the four-input operational amplifier 8 back to the current source 6 of the Veff detector circuit 1 (feedback input) and controls the current value Iss/2 of the current source 6 so that the relation of the positive input voltage VEP and the negative input voltage VEN which are inputted to the four-input operational amplifier 8, as compared with the relation of the positive reference voltage VERP and the negative reference voltage VERN, should be VEP−VEN=VERP−VERN, in other words, so that the difference between the positive input voltage VEP and the negative input voltage VEN outputted from the transistors M1 and M2, respectively, may be equal to the saturation voltage Veff.

As discussed above, in the embodiment 1, since the values of the positive input voltage VEP and the negative input voltage VEN generated by the Veff detector circuit 1 are controlled, on the basis of the positive reference voltage VERP and the negative reference voltage VERN which are externally inputted, to generate the bias voltage VB, it is possible to produce an effect of allowing an output of the bias voltage VB having an accurate value without any effect of variations in elements constituting the bias circuit.

Embodiment 2

In the bias circuit of the embodiment 1, when the outputted bias voltage VB becomes stable near 0 V, since no voltage is applied to, e.g., a gate of a transistor which is a constitute of the current source 6 and no current flows in the half-circuit 2, there is some case where the desired bias voltage VB can not be obtained. In order to avoid such a case, a bias circuit of the embodiment 2 comprises a start-up circuit.

Figure 5:
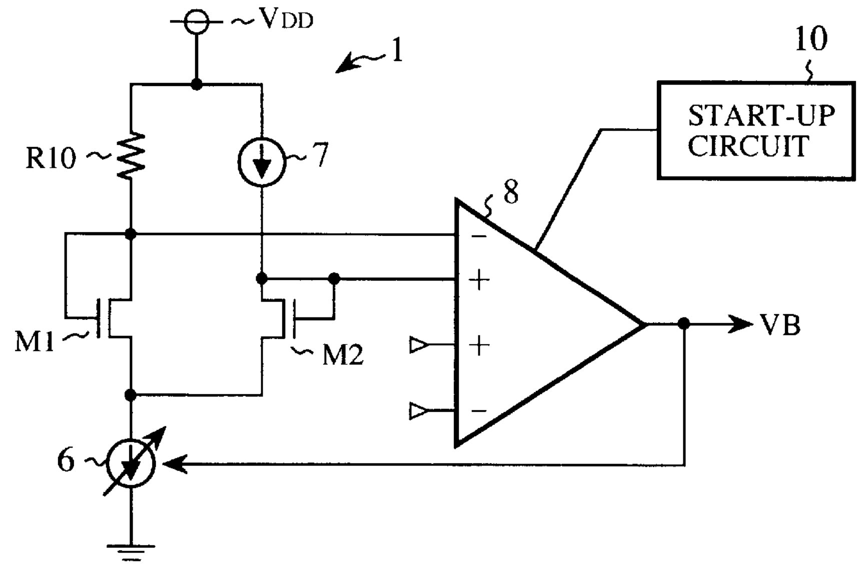
FIG. 5 is an illustration of a bias circuit in accordance with an embodiment 2 of the present invention.

FIG. 5 is an illustration of a bias circuit in accordance with an embodiment 2 of the present invention. Constituent elements identical or corresponding to those in the bias circuit of FIG. 1 are represented by the same signs and discussion thereof will be omitted. In FIG. 5, reference numeral 10 denotes a start-up circuit included in the four-input operational amplifier 8.

Figure 6:
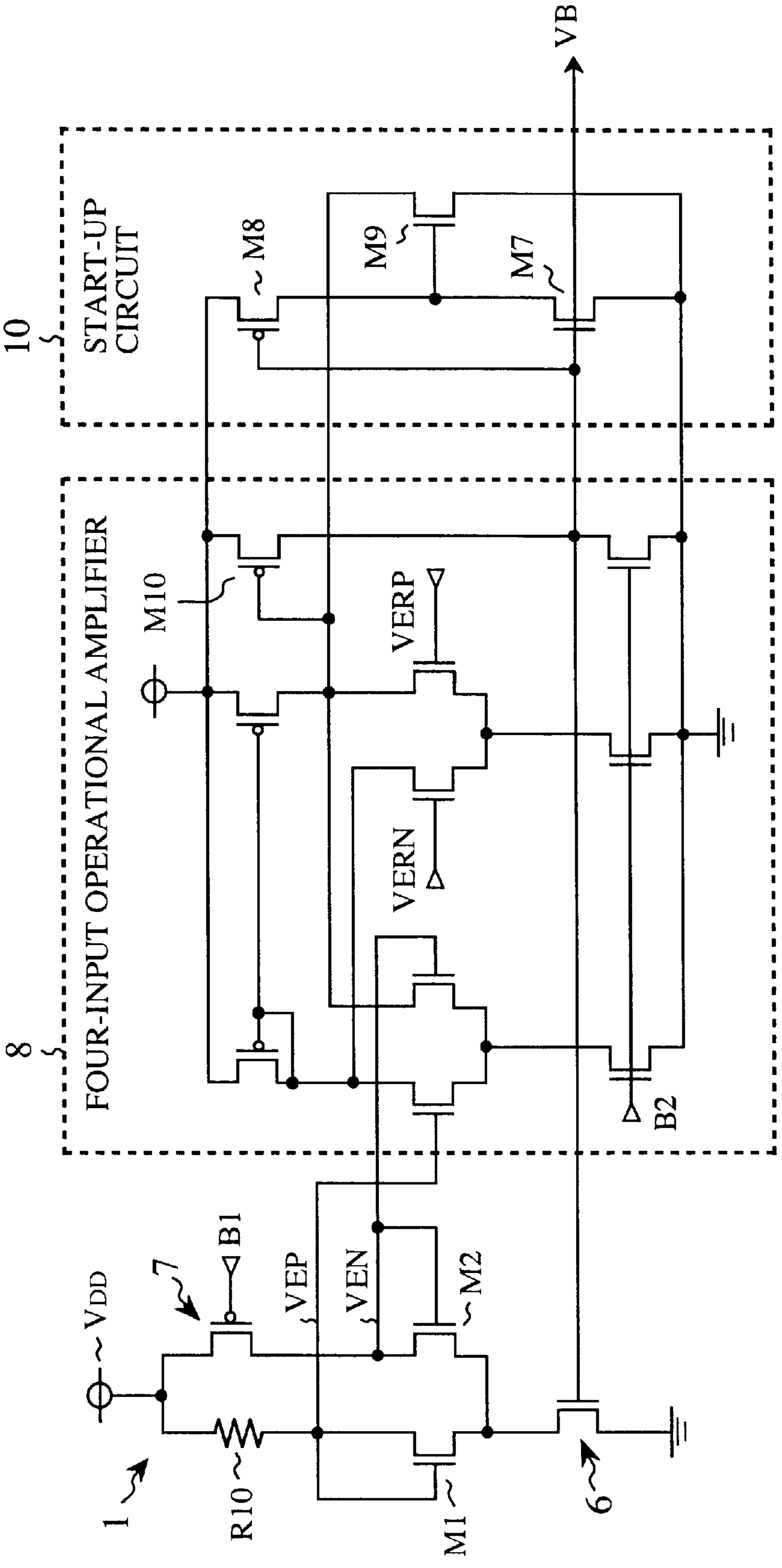
FIG. 6 is a circuit diagram showing an example of the bias circuit in accordance with the embodiment 2 of the present invention.

FIG. 6 is a circuit diagram showing an example of the bias circuit in accordance with the embodiment 2 of the present invention. Constituent elements identical to those in the bias circuit of FIG. 5 are represented by the same signs and discussion thereof will be omitted. In FIG. 6, reference sign M10 denotes a transistor included in the four-input operational amplifier 8, for outputting the bias voltage VB, and M7, M8 and M9 denote transistors constituting the start-up circuit (start-up means) 10. Further, the transistors M10 and M8 have gates of inverter input.

In the example of the start-up circuit 10 shown in FIG. 6, the bias voltage VB generated by the four-input operational amplifier 8 is applied to the gates of the transistors M7 and M8 and a drain of the transistor M7 is connected to a source of the transistor M8 and a gate of the transistor M9. Further, a source of the transistor M7 is grounded, and the power supply voltage is applied to a drain of the transistor M8. A source of the transistor M9 is grounded and a drain thereof is connected to, e.g., a gate of the transistor M10.

Next, an operation will be discussed.

When the bias voltage VB outputted from the four-input operational amplifier 8 is stable near 0 V, the transistor M7 is in an OFF state and the transistor M8 having the gate of inverter input is in an ON state. The power supply voltage is thereby applied to the gate of the transistor M9. The transistor M9 therefore comes into an ON state to lower a gate voltage of the transistor M10 whose gate is supplied with a predetermined voltage, and a current starts flowing between the drain and source of the transistor M10, to thereby generate the originally-desired bias voltage VB.

Further, the start-up circuit 10 needs to come into an OFF state when the originally-desired bias voltage VB starts to be outputted from the four-input operational amplifier 8. Then, the size of the transistor M7 is set sufficiently larger than that of the transistor M8 so that the transistor M9 may comes into the OFF state when the bias voltage VB comes close to the originally-desired bias voltage value, to thereby lower a gate voltage of the transistor M9 when the originally-desired bias voltage VB starts to be outputted.

As discussed above, in the embodiment 2, since the bias circuit comprises the start-up circuit 10, it is possible to produce an effect of preventing the bias circuit from becoming stable in not originally-desired state at power-up.

Embodiment 3

Figure 7:
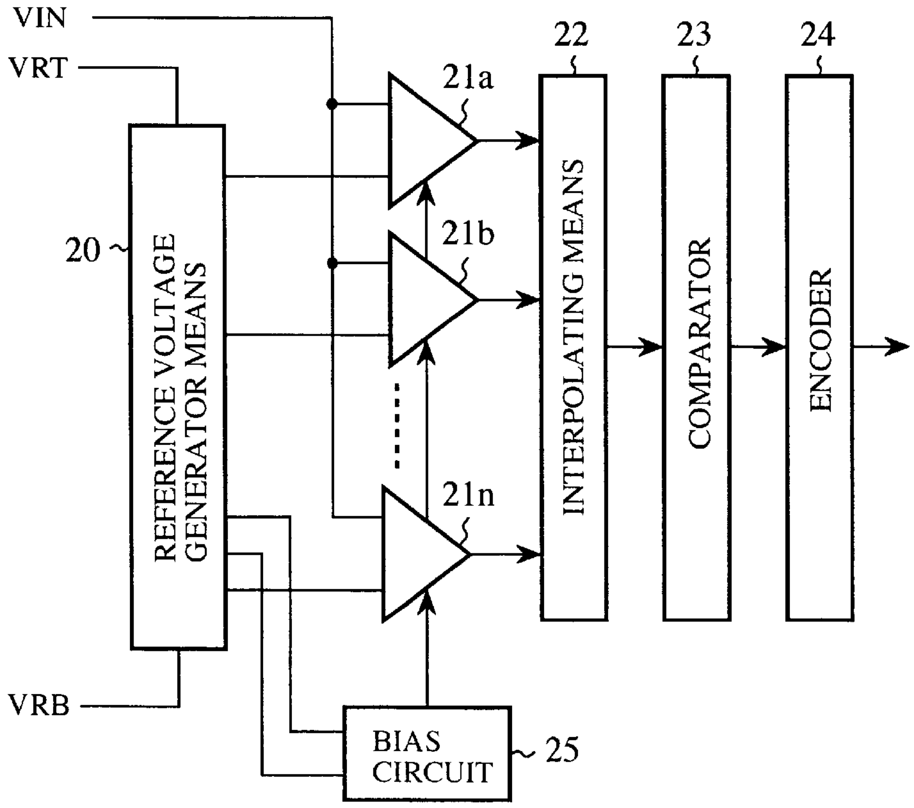
FIG. 7 is a block diagram showing a constitution of a flash-type A/D converter using a bias circuit in accordance with an embodiment 3 of the present invention.

FIG. 7 is a block diagram showing a constitution of a flash-type A/D converter using a bias circuit in accordance with an embodiment 3 of the present invention. In FIG. 7, reference numeral 20 denotes reference voltage generator means for generating the reference voltage; reference signs 21*a* to 21*n* denote preamplifiers; 22 denotes interpolating means; 23 denotes a comparator; 24 denotes an encoder; and 25 denotes a bias circuit.

Figure 8:
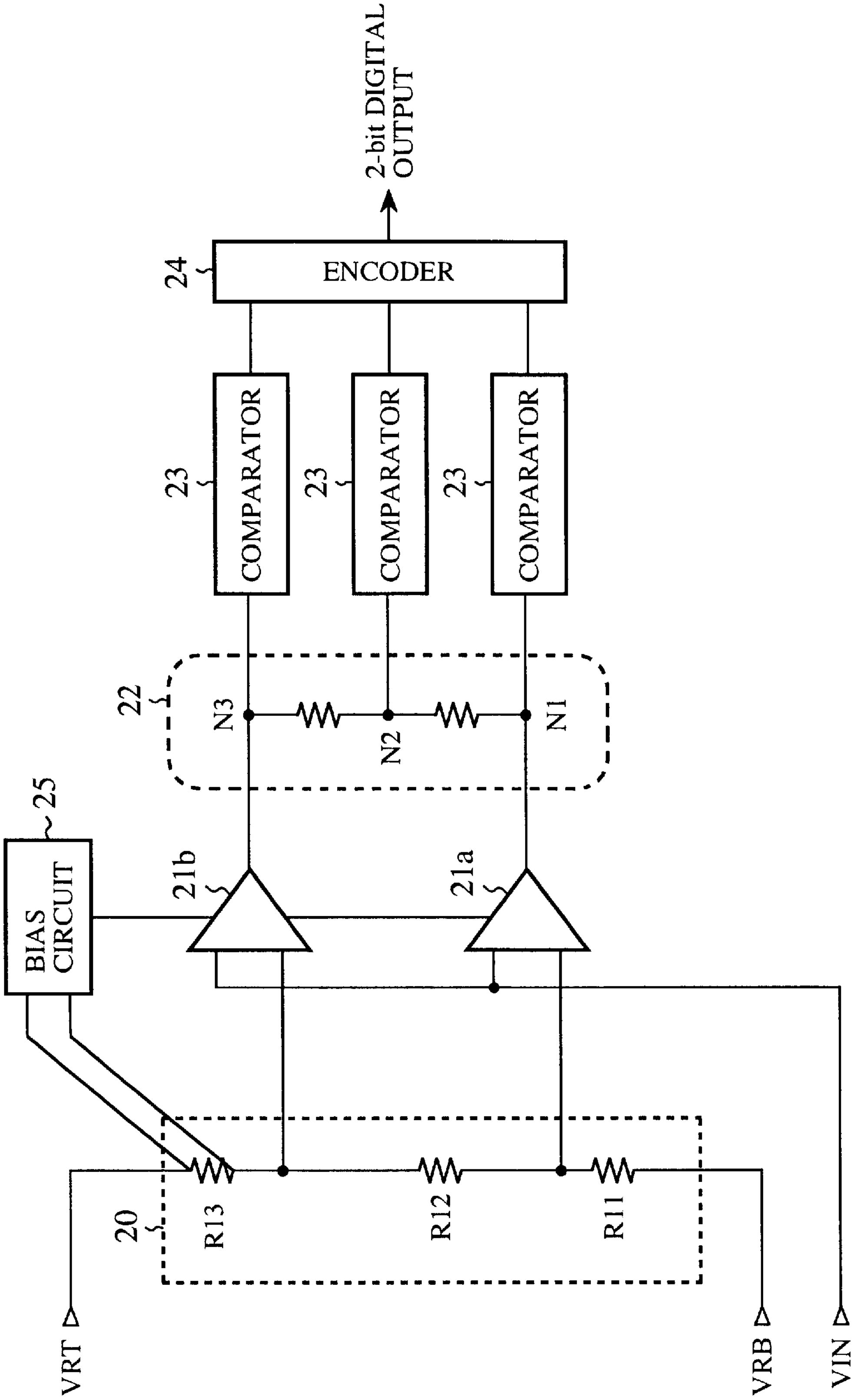
FIG. 8 is an illustration showing an example of the flash-type A/D converter using the bias circuit in accordance with the embodiment 3 of the present invention.

FIG. 8 is an illustration showing an example of the flash-type A/D converter using the bias circuit in accordance with the embodiment 3 of the present invention. Constituent elements identical or corresponding to those of FIG. 7 are represented by the same signs and discussion thereof will be omitted. In FIG. 8, reference signs R11, R12 and R13 denote resistors constituting the reference voltage generator means 20. Further, the input range of the flash-type A/D converter shown in FIGS. 7 and 8 is in the range from a voltage VRB to a voltage VRT.

Figure 9:
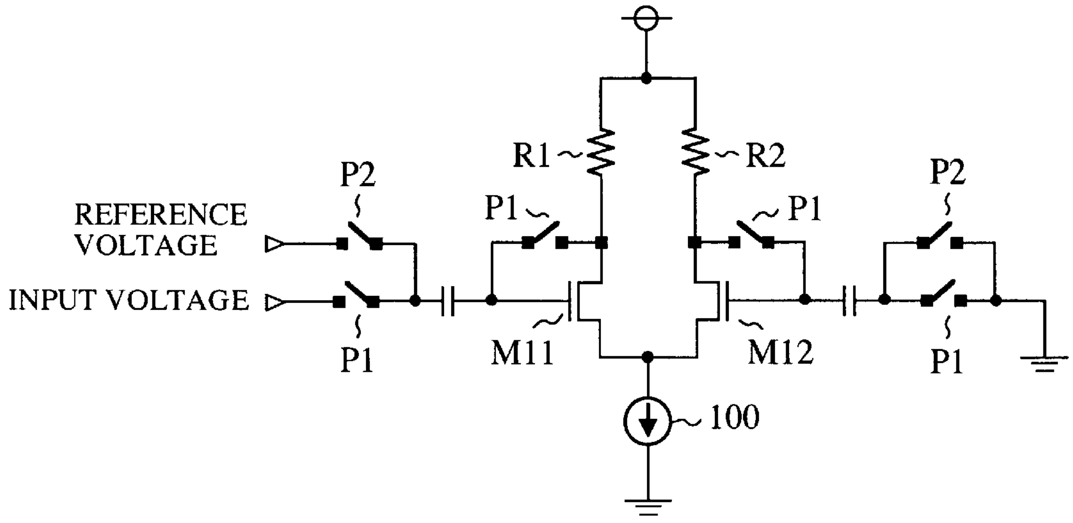
FIG. 9 is an illustration showing an equivalent circuit of a preamplifier.

FIG. 9 is an illustration showing an equivalent circuit of the preamplifier 21*a*. Constituent elements identical or corresponding to those in the equivalent circuit of FIG. 3 are represented by the same signs and discussion thereof will be omitted. Reference signs P1 and P2 denote virtual contacts which open and close at a predetermined clock timing, indicating whether a signal is inputted or not.

Next, an operation will be discussed.

For simple discussion, an operation for converting an analog value ranging from the voltage VRT to the voltage VRB shown in FIG. 8 into a 2-bit digital value will be discussed as an example herein. The reference voltage generator means 20 which is a constituent of the 2-bit flash-type A/D converter shown in FIG. 8 uses a ladder tap constituted of the resistors R11, R12 and R13 which are connected in series to one another, and the voltage VRB is applied to one end of the resistor R11 and the voltage VRT is applied to one end of the resistor R13. The other end of the resistor R11 is connected to one end of the resistor R12, and the voltage at the node is supplied to the preamplifier 21*a* as the reference voltage. Further, the other end of the resistor R13 is connected to the other end of the resistor R12, and the voltage at the node is supplied to the preamplifier 21*b* as the reference voltage.

The bias circuit 25 obtains the reference voltage which is used for generation of the bias voltage from the reference voltage generator means 20 and supplies the predetermined bias voltage to the preamplifiers 21*a* and 21*b*, thereby operating the preamplifiers 21*a* and 21*b*. Further, the reference voltage which the bias circuit 25 obtains from the reference voltage generator means 20 is, e.g., the positive reference voltage VERP or the negative reference voltage VERN shown in FIG. 1.

The preamplifiers 21*a* and 21*b*, which are supplied with the bias voltage from the bias circuit 25, each receives an input voltage VIN and the predetermined reference voltage generated by the reference voltage generator means 20. The preamplifier 21*a* receives the input voltage VIN and the reference voltage generated at the node between the resistors R11 and R12 and outputs a voltage N1. The preamplifier 21*b* receives the input voltage VIN and the reference voltage generated at the node between the resistors R12 and R13 and outputs a voltage N3.

Herein, operations of the preamplifiers 21*a* and 21*b* shown in FIG. 8 will be discussed. In the equivalent circuit of the preamplifiers 21*a* and 21*b* shown in FIG. 9, the circuit comes into an autozero state when the contact P1 is closed; to perform a sampling of the input voltage. After that, the circuit receives the reference voltage in a state where the contact P2 is closed to compare the reference voltage with the sampled input voltage and amplifies the comparison result to output the same to the interpolating means 22.

The interpolating means 22 receiving the voltages N1 and N3, which has a constitution of ladder tap constituted of two resistors which are connected in series to each other as shown in FIG. 8, divides the potential difference between the inputted voltages N1 and N3 by these two resistors and outputs a voltage N2 at a node between the resistors. The voltages N1, N2 and N3 are inputted to the encoder 24 through the comparators 23. On the basis of these voltages N1, N2 and N3, a 2-bit digital value is outputted.

Figure 10:
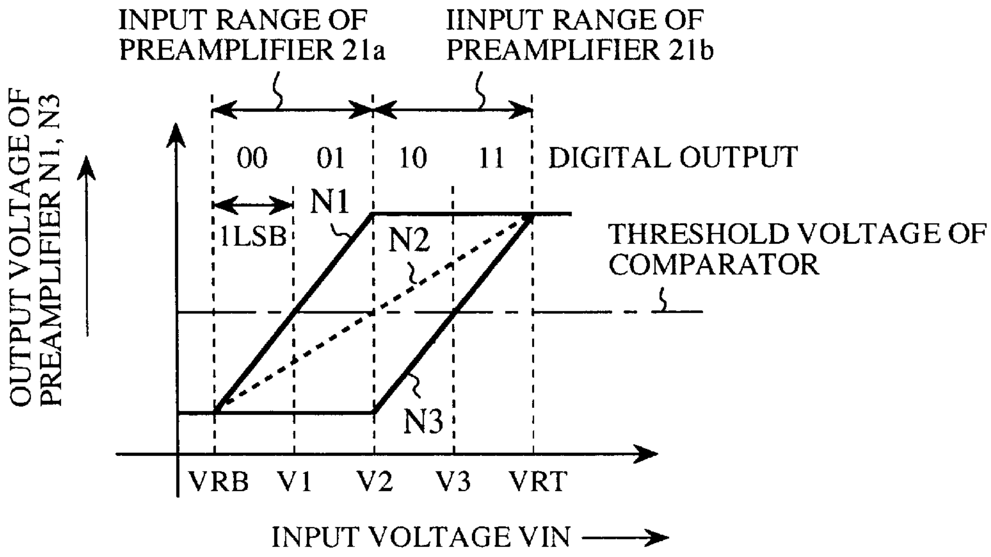
FIG. 10 is an illustration showing input/output characteristic of the preamplifier.

FIG. 10 is an illustration showing input/output characteristic of the preamplifiers 21*a* and 21*b*. In FIG. 10, the vertical axis indicates the output voltages of the preamplifiers 21*a* and 21*b* and the horizontal axis indicates an analog input which is inputted to the A/D converter, i.e., the input voltage VIN of the preamplifiers 21*a* and 21*b*. In this figure, N1 represented by a solid line indicates the voltage outputted from the preamplifier 21*a* and N3 also represented by a solid line indicates the voltage outputted from the preamplifier 21*b*. Further, N2 represented by a broken line indicates a voltage generated by the interpolating means 22, which is used for switching between the voltages N1 and N3 to be converted in a digital value by the encoder 24. The alternate long and short dash line indicates a threshold voltage of the comparator 23 and an output voltage of the comparator 23 is converted in a digital value of "0" or "1" by the encoder 24 with the threshold voltage used as a boundary point. Further, the interpolating means 22 of the flash-type A/D converter shown in FIG. 8 divides the voltage outputted from the preamplifiers 21*a* and 21*b* into two, as can be seen from the voltage N2 of FIG. 10, and the voltage N2 is a tap voltage of the voltages N1 and N3.

In FIG. 10, when the voltage VRB which is the lower limit of the input range of the flash-type A/D converter shown in FIG. 8 is inputted, both the preamplifiers 21*a* and 21*b* output a voltage of lower limit. For example, when the input voltage VIN is a voltage V1, the preamplifier 21*a* outputs the threshold voltage of the comparator 23 and the preamplifier 21*b* outputs a voltage of lower limit. When the input voltage VIN is in the range from the voltage VRB to the voltage V1, since neither of the preamplifiers outputs a voltage over the threshold voltage of the comparator 23, an output which is converted into a digital value (hereinafter, referred to as "digital output") is "00".

When the input voltage VIN is the voltage V2, for example, the voltage N1 outputted from the preamplifier 21*a* becomes the upper limit value and the voltage N3 outputted from the preamplifier 21*b* becomes the lower limit value. At this time, the voltage N2 which is equivalent to the threshold voltage of the comparator 23 is outputted from the interpolating means 22. When the input voltage VIN is in the range from the voltage V1 to the voltage V2, the preamplifier 21*a* outputs the voltage N1 which exceeds the threshold voltage of the comparator 23. Further, the encoder 24 outputs a digital value having the higher order bit of "0" which is set since the voltage N2 does not exceed the threshold voltage of the comparator 23 and the lower order bit of "1" which is set on the basis of the voltage N1 outputted from the preamplifier 21*a*.

When the input voltage VIN is the voltage V3, for example, the voltage N2 outputted from the interpolating means 22 exceeds the threshold voltage of the comparator 23 and the voltage N3 outputted from preamplifier 21*b* is equivalent to the threshold voltage of the comparator 23 or a value not exceeding the threshold voltage. At this time, the encoder 24 outputs a 2-bit digital value having the higher order bit of "1" which is set since the voltage N2 exceeds the threshold voltage of the comparator 23 and the lower order bit of "0" which is set on the basis of the voltage N3 outputted from the preamplifier 21*b*. Further, the voltage N1 outputted from the preamplifier 21*a* becomes constant at the upper limit voltage value, and serves as a saturation power.

When the input voltage VIN is the upper limit voltage VRT, for example, the voltage N3 outputted from the preamplifier 21*b* becomes the upper limit voltage. The encoder 24 outputs a digital value having the higher order bit of "1" which is set since the voltage N3 exceeds the threshold voltage of the comparator 23 and the voltage N2 also exceeds the threshold voltage and the lower order bit of "1" which is set on the basis of the voltage N3 outputted from the preamplifier 21*b*. Further, the voltage N1 outputted from the preamplifier 21*a* becomes constant at the upper limit voltage value, being a saturation power.

As is understood from the above discussion, switching between the preamplifiers 21*a* and 21*b* is performed on the basis of the voltage N2 generated by the interpolating means 22. In the 2-bit A/D converter discussed above, when the higher order bit is "0", the lower order bit is converted into a digital value on the basis of the voltage N1 outputted from the preamplifier 21*a* and when the higher order bit is "1", the lower order bit is converted into a digital value on the basis of the voltage N3 outputted from the preamplifier 21*b*. In summary, the input range of the preamplifier 21*a* ranges from the voltage VRB to the voltage V2 and that of the preamplifier 21*b* ranges from the voltage V2 to the voltage VRT. Thus, the input ranges of the two preamplifiers 21*a* and 21*b* depend on the voltage N2 generated by the interpolating means 22. Further, a voltage ranging from the voltage VRB to the voltage V1, a voltage ranging from the voltage V1 to the voltage V2, a voltage ranging from the voltage V2 to the voltage V3 and a voltage ranging from the voltage V3 to the voltage VRT are each a voltage equivalent to 1 LSB which is set in advance in designing the A/D converter.

For proper generation of the voltage N2 by the interpolating means 22, it is necessary to set the input ranges of the preamplifiers 21*a* and 21*b* to be over ±1 LSB. If the input ranges are set larger than necessary, however, gains of the preamplifiers 21*a* and 21*b* are lowered. Therefore, it is preferable that the input ranges of the preamplifiers 21*a* and 21*b* should be a voltage range equivalent to ±1 LSB, i.e., 2 LSB.

Since the voltage equivalent to 1 LSB is limited by the input range of the A/D converter, i.e., the range from the voltage VRT to the voltage VRB and necessarily determined. Since the input range of the A/D converter allows various settings depending on system requirements and specifications, it is impossible to determine the input ranges of the preamplifiers 21*a* and 21*b* in advance.

Then, the bias circuit 25 for supplying the bias voltage to the preamplifiers 21*a* and 21*b* uses the bias circuit of the embodiment 1 and operates with the positive reference voltage VERP and the negative reference voltage VERN obtained from the reference voltage generator means 20, appropriately controlling the bias voltage which is supplied with the preamplifiers 21*a* and 21*b* in accordance with the input range of the A/D converter, to determine the respective input ranges of the preamplifiers 21*a* and 21*b*.

In order to set the respective input ranges of the preamplifiers 21*a* and 21*b* to ±1 LSB, the respective values of the resistors R11, R12 and R13 constituting the reference voltage generator means 20 are controlled so that a tap voltage having a value near 1 LSB/√2 can be obtained from the reference voltage generator means 20 and the positive reference voltage VERP and the negative reference voltage VERN are supplied to the bias circuit 25. Further, there may be a case where a voltage value equivalent to 1 LSB, with some allowance, is supplied to the bias circuit 25 as the positive reference voltage VERP and the negative reference voltage VERN to operate the preamplifiers 21*a* and 21*b* with input ranges of ±√2×1 LSB.

As discussed above, in the embodiment 3, since the flash-type A/D converter having a plurality of preamplifiers 21*a* to 21*n* includes the reference voltage generator means 20 and the bias circuit 25 for generating the bias voltage on the basis of the reference voltage obtained from the reference voltage generator means 20 to supply the preamplifiers 21*a* to 21*n* with the bias voltage having an accurate value, it is possible to produce an effect that the input range of the flash-type A/D converter can be properly determined to compensate performance degradation of the A/D converter caused by variations in circuit elements and the like.

Embodiment 4

A folding and interpolating A/D converter which is composed of a high-order bit comparison A/D converter and a low-order bit comparison A/D converter, and performs a digital lower order bits. The high-order bit comparison A/D converter uses the flash-type A/D converter as described in the embodiment 3. The low-order bit comparison A/D converter obtains an output of lower order bits by interpolating an output of a folding amplifier provided for each bit. In the embodiment 4, discussion will be presented on a bias circuit included in a folding and interpolating A/D converter comprising folding amplifiers used for conversion of lower order bits.

Figure 11:
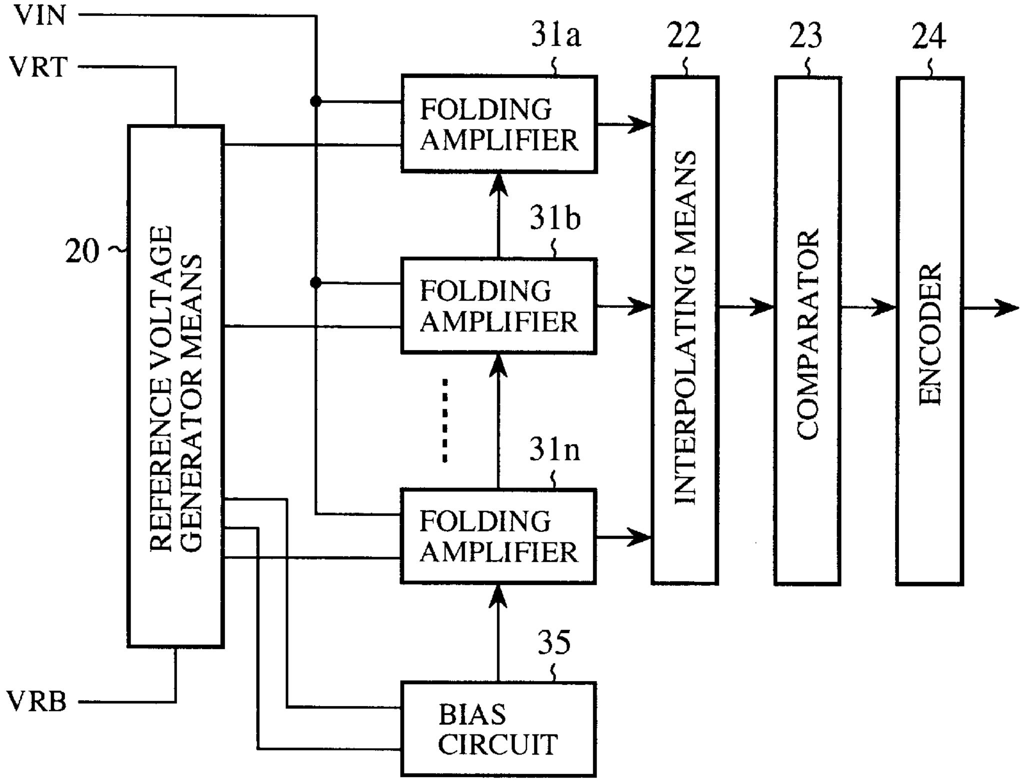
FIG. 11 is a block diagram showing a constitution of a folding and interpolating A/D converter using a bias circuit in accordance with an embodiment 4 of the present invention.

FIG. 11 is a block diagram showing a constitution of a folding and interpolating A/D converter using a bias circuit in accordance with the embodiment 4 of the present invention. Constituent elements identical or corresponding to those in the flash-type A/D converter of FIG. 7 are represented by the same signs and discussion thereof will be omitted. In FIG. 11, reference signs 31*a* to 31*n* each denotes a folding amplifier; and reference numeral 35 denotes a bias circuit for supplying a bias voltage to the folding amplifiers 31*a* to 31*n*. Further, in the folding and interpolating A/D converter of FIG. 11, a portion using a plurality of folding amplifiers 31*a* to 31*n*, for dealing with the lower order bit, is shown and a flash-type A/D converter for dealing with the higher order bit is omitted.

Figure 12:
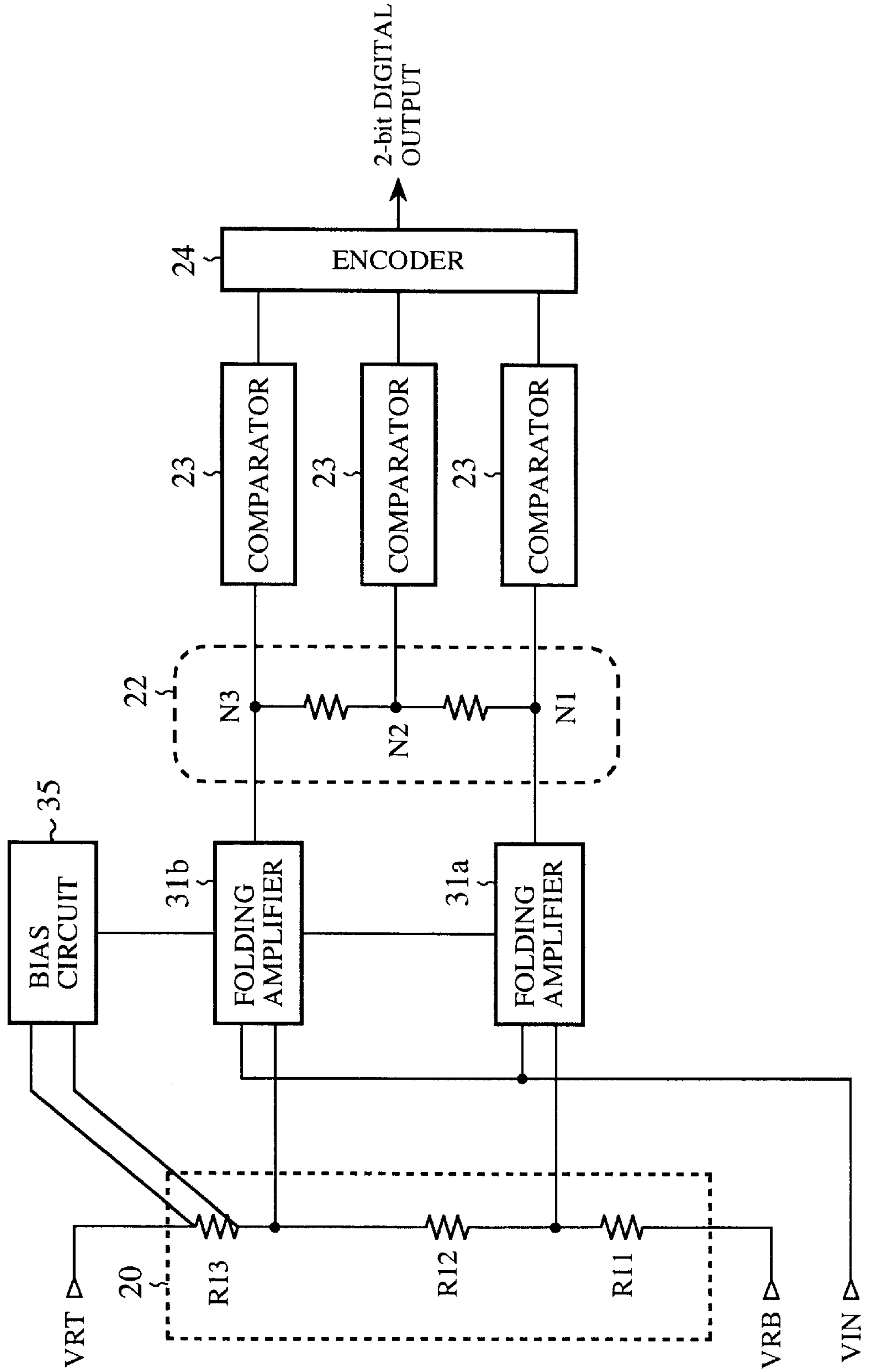
FIG. 12 is an illustration showing an example of the folding and interpolating A/D converter using the bias circuit in accordance with the embodiment 4 of the present invention.

FIG. 12 is an illustration showing an example of the folding and interpolating A/D converter using the bias circuit in accordance with the embodiment 4 of the present invention. Constituent elements identical to those in the folding and interpolating A/D converter of FIG. 11 are represented by the same signs and discussion thereof will be omitted. Further, FIG. 12 shows the folding and interpolating A/D converter having a constitution for outputting 2-bit data as an example, for simple discussion.

Figure 13:
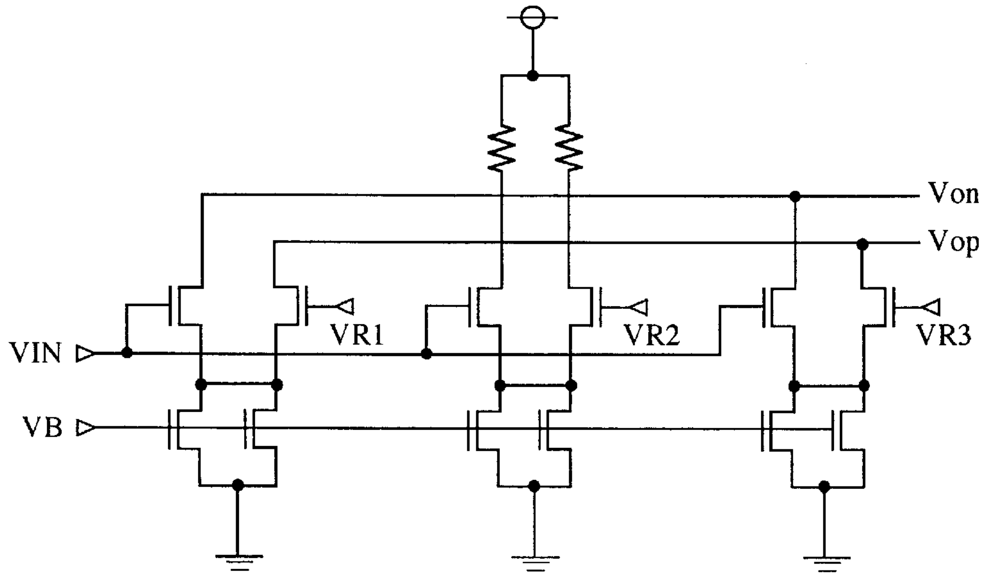
FIG. 13 is an illustration showing an equivalent circuit of a folding amplifier.

FIG. 13 is an illustration showing an equivalent circuit of the folding amplifiers 31*a* to 31*n*. This figure shows an exemplary configuration in which the folding amplifier 31*a*, for example, receives a plurality of reference voltages VR1, VR2 and VR3 and outputs a folding output voltage as a differential voltage. The interpolating means 22 and the like in the folding and interpolating A/D converter comprising the folding amplifiers 31*a* to 31*n* of the embodiment 4 have a constitution for dealing with a differential voltage. In FIG. 13, reference sign VB represents a bias voltage supplied from the bias circuit 35, VIN represents an input voltage of the folding and interpolating A/D converter and VR1, VR2 and VR3 represent reference voltages supplied from the reference voltage generator means 20. Reference sign Vop represents a positive output voltage outputted from the folding amplifiers 31*a* to 31*n* and Von represents a negative output voltage outputted from the folding amplifiers 31*a* to 31*n*.

Next, an operation will be discussed.

In the folding and interpolating A/D converter, the reference voltages generated by the reference voltage generator means 20 and the input voltage VIN to be converted into a digital value are inputted to the folding amplifiers 31*a* to 31*n*, the respective outputs from the folding amplifiers 31*a* to 31*n* are inputted to the interpolating means 22 and interpolated therein, and the output voltages from the interpolating means 22 are inputted through the comparators 23 to the encoder 24 and converted into digital code therein. Further, by supplying the bias voltage appropriate to the input ranges of the folding amplifiers 31*a* to 31*n* from the bias circuit 35, the input range of the folding and interpolating A/D converter is compensated in a predetermined range. Furthermore, the input range of the folding and interpolating A/D converter shown in FIGS. 11 and 12 ranges from the voltage VRB to the voltage VRT.

Figure 14:
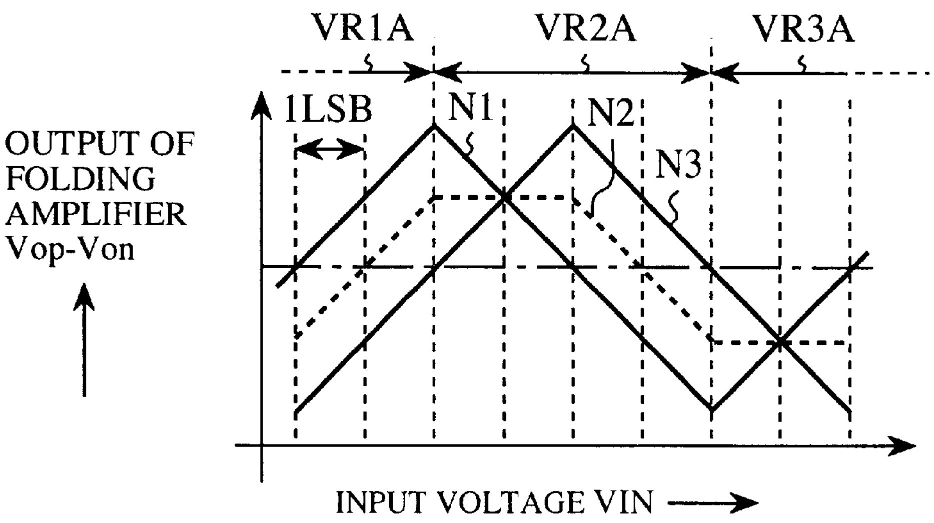
FIG. 14 is an illustration showing input/output characteristic of the folding amplifier.
Figure 15:
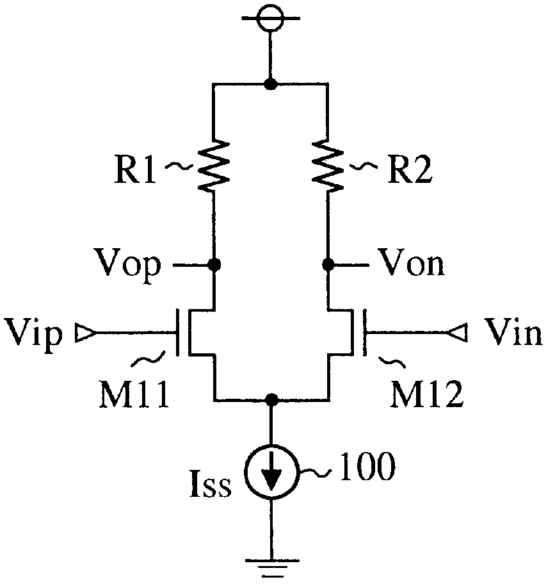
FIG. 15 (PRIOR ART)
FIG. 15 is an illustration of a differential amplifier using a conventional bias circuit.
Figure 16:
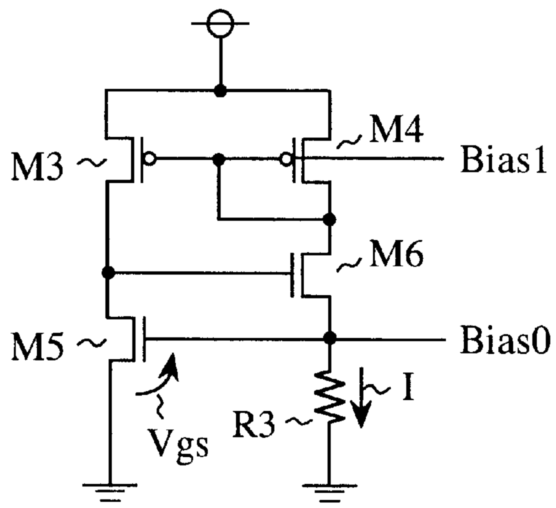
FIG. 16 (PRIOR ART)
FIG. 16 is an illustration of the conventional bias circuit.
Figure 17:
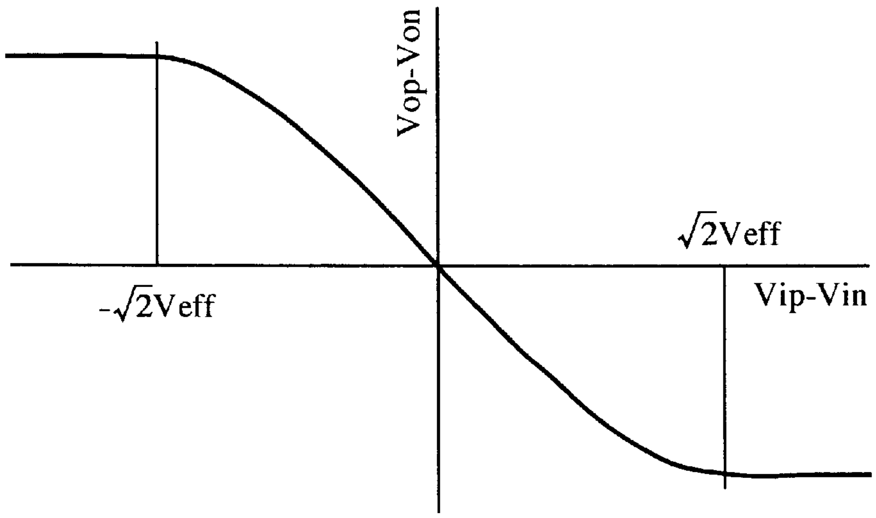
FIG. 17 (PRIOR ART)
FIG. 17 is an illustration showing input/output characteristic of the differential amplifier.

FIG. 14 is an illustration showing input/output characteristic of the folding amplifier. In FIG. 14, the vertical axis indicates the output voltages of the folding amplifiers 31*a* and 31*b* and the horizontal axis indicates the input voltage VIN to be inputted to the folding and interpolating A/D converter. FIG. 14 shows the output voltages of only the folding amplifiers 31*a* and 31*b* included in the folding and interpolating A/D converter for 2-bit output shown in FIG. 12 as examples, for simple illustration. In this figure, N1 represented by a solid line indicates the voltage outputted from the folding amplifier 31*a* and N3 also represented by a solid line indicates the voltage outputted from the folding amplifier 31*b*. Further, since the folding amplifiers 31*a* and 31*b* output the output voltages Vop and Von which are differential voltages as shown in FIG. 13, the voltages N1 and N3 indicate respective values of Vop−Von of the folding amplifiers 31*a* and 31*b*. Furthermore, N2 represented by a broken line indicates a voltage generated by the interpolating means 22, which is herein a tap voltage obtained by equally dividing the voltages N3 and N1 into two.

An operation of the folding amplifier 31*a* out of a plurality of folding amplifiers 31*a* to 31*n* included in the folding and interpolating A/D converter will be discussed as an example. As discussed earlier, the folding amplifier 31*a* has a circuit configuration consisting of three differential pairs, such as shown in the equivalent circuit of FIG. 13, and operates with the three reference voltages VR1, VR2 and VR3 received from the reference voltage generator means 20. The output voltage N1 of the folding amplifier 31*a* shown in FIG. 14 increases while the input voltage VIN is in a range VR1A, decreases while the input voltage VIN is in a range VR2A, and increases again while the input voltage VIN is in a range VR3A. Thus, in the folding amplifier 31*a*, the output voltage N1 repeats the increase and decrease in response to the increase of the input voltage VIN.

The values of the input voltage VIN at the points where the output voltage N1 turns from the increase to the decrease and vice versa are determined by the reference voltages VR1, VR2 and VR3. The input/output characteristic shown in FIG. 14 indicates the voltage N1 outputted from the folding amplifier 31*a* in the range VR1A determined by the reference voltage VR1, the range VR2A determined by the reference voltage VR2 and the range VR3A determined by the reference voltage VR3.

Further, the folding amplifier 31*b* outputs the voltage N3, repeating the increase and decrease in response to the increase of the input voltage VIN on the basis of the three reference voltages obtained from the reference voltage generator means 20, like the folding amplifier 31*a*. The folding and interpolating A/D converter operates to perform a digital conversion of the output voltages from the folding amplifiers 31*a* to 31*n*, and the respective reference voltages for the folding amplifiers are determined so that the voltages outputted from the folding amplifiers 31*a* to 31*n* should not turn in response to the same input voltage VIN, like the voltages N1 and N3 shown in FIG. 14.

The bias circuit 35 included in the folding and interpolating A/D converter has the same constitution as the bias circuit of the embodiment 1, and receives the positive reference voltage VERP and the negative reference voltage VERN supplied from the reference voltage generator means 20 to generate a bias voltage. The folding amplifiers 31*a* to 31*n* which are supplied with the bias voltage generated with accuracy can properly operate, turning the output voltages in the response to the predetermined input voltage VIN, and the folding output voltages of a plurality of folding amplifiers 31*a* to 31*n* are properly inputted to the encoder 24.

As discussed above, in the embodiment 4, since the folding and interpolating A/D converter is provided with the bias circuit for generating the bias voltage on the basis of the reference voltage and supplies the folding amplifiers 31*a* to 31*n* with an accurate bias voltage, it is possible to produce an effect that the input range of the folding and interpolating A/D converter can be properly determined to compensate performance degradation caused by variations in circuit elements.

What is claimed is:

1. A bias circuit comprising:

saturation voltage detector means for detecting a saturation voltage from a bias voltage which is fed back to generate an input voltage; and operational amplifier means receiving said input voltage outputted from said saturation voltage detector means, for generating a bias voltage by using a reference voltage which is externally inputted.

2. The bias circuit according to claim 1, wherein said saturation voltage detector means comprises a resistor and a microcurrent source which are supplied with a power supply voltage, a first transistor and a second transistor and a current source, said first transistor whose drain and gate are connected to said resistor which is supplied with said power supply voltage, said second transistor whose drain and gate are connected to said microcurrent source which is supplied with said power supply voltage, said current source has a constitution in which a source of said first transistor and a source of said second transistor are connected to each other, and the current value of said current source is controlled on the basis of said bias voltage which is fed back from said operational amplifier means to output said input voltage from a connecting portion between said drain and gate of said first transistor and a connecting portion between said drain and gate of said second transistor.

3. The bias circuit according to claim 1, wherein said operational amplifier means is four-input operational amplifier means receiving an input voltage which is a differential voltage and a reference voltage to generate said bias voltage.

4. The bias circuit according to claim 1, further comprising:

start-up means for preventing an abnormal operation at power-up.

5. The bias circuit according to claim 4, wherein said start-up means applies a predetermined voltage to said operational amplifier means to start generation of said bias voltage.

* * * * *